United States Patent
Shatalov et al.

(10) Patent No.: US 9,741,899 B2
(45) Date of Patent: Aug. 22, 2017

(54) DEVICE WITH INVERTED LARGE SCALE LIGHT EXTRACTION STRUCTURES

(71) Applicant: Sensor Electronic Technology, Inc., Columbia, SC (US)

(72) Inventors: Maxim S. Shatalov, Columbia, SC (US); Alexander Dobrinsky, Loudonville, NY (US); Michael Shur, Latham, NY (US); Remigijus Gaska, Columbia, SC (US)

(73) Assignee: Sensor Electronic Technology, Inc., Columbia ( * ) Notice: Subject to any disclaimer, the term of this patent is extended or adjusted under 35 U.S.C. 154(b) by 0 days.

(21) Appl. No.: 14/728,435

(22) Filed: Jun. 2, 2015

(65) Prior Publication Data
US 2016/0049551 A1    Feb. 18, 2016

Related U.S. Application Data

(63) Continuation-in-part of application No. 13/524,350, filed on Jun. 15, 2012, now Pat. No. 9,048,378.
(Continued)

(51) Int. Cl.
*H01L 29/06*    (2006.01)
*H01L 31/00*    (2006.01)
(Continued)

(52) U.S. Cl.
CPC ............ *H01L 33/22* (2013.01); *C30B 29/403* (2013.01); *C30B 29/68* (2013.01);
(Continued)

(58) Field of Classification Search
CPC ..... H01L 33/20; H01L 33/22; H01L 33/0079; H01L 2933/0083; H01L 2933/0091
See application file for complete search history.

(56) References Cited

U.S. PATENT DOCUMENTS

| 4,497,974 A | 2/1985 | Deckman et al. |
| 5,779,924 A | 7/1998 | Krames et al. |

(Continued)

FOREIGN PATENT DOCUMENTS

| JP | 2003197963 A | 7/2003 |
| JP | 2009242130 A | 12/2009 |

(Continued)

OTHER PUBLICATIONS

Alam, M., U.S. Appl. No. 14/297,656, Notice of Allowance, Jan. 11, 2016, 16 pages.
(Continued)

*Primary Examiner* — Jesse Y Miyoshi
(74) *Attorney, Agent, or Firm* — Labatt, LLC

(57) ABSTRACT

An interface including roughness components for improving the propagation of radiation through the interface is provided. The interface includes a first profiled surface of a first layer comprising a set of large roughness components providing a first variation of the first profiled surface having a first characteristic scale and a second profiled surface of a second layer comprising a set of small roughness components providing a second variation of the second profiled surface having a second characteristic scale. The first characteristic scale is approximately an order of magnitude larger than the second characteristic scale. The surfaces can be bonded together using a bonding material, and a filler material also can be present in the interface.

20 Claims, 10 Drawing Sheets

Related U.S. Application Data

(60) Provisional application No. 61/497,489, filed on Jun. 15, 2011, provisional application No. 61/510,603, filed on Jul. 22, 2011.

(51) Int. Cl.
*H01L 33/22* (2010.01)
*C30B 29/68* (2006.01)
*C30B 29/40* (2006.01)
*H01L 33/00* (2010.01)
*H01L 33/20* (2010.01)
*H01S 5/022* (2006.01)
*B82Y 20/00* (2011.01)
*H01S 5/343* (2006.01)

(52) U.S. Cl.
CPC .......... *H01L 33/0079* (2013.01); *H01L 33/20* (2013.01); *H01S 5/0224* (2013.01); *B82Y 20/00* (2013.01); *H01L 2933/0083* (2013.01); *H01L 2933/0091* (2013.01); *H01S 5/34333* (2013.01)

(56) References Cited

U.S. PATENT DOCUMENTS

| | | |
|---|---|---|
| 6,441,403 B1 | 8/2002 | Chang et al. |
| 6,649,939 B1 | 11/2003 | Wirth |
| 6,657,236 B1 | 12/2003 | Thibeault et al. |
| 6,791,119 B2 | 9/2004 | Slater, Jr. et al. |
| 7,211,831 B2 | 5/2007 | Erchak et al. |
| 7,335,920 B2 | 2/2008 | Denbaars et al. |
| 7,355,210 B2 | 4/2008 | Ou et al. |
| 7,473,936 B2 | 1/2009 | Tran et al. |
| 7,524,686 B2 | 4/2009 | Chu et al. |
| 7,629,195 B2 | 12/2009 | Tran et al. |
| 7,704,763 B2 | 4/2010 | Fujii et al. |
| 7,897,420 B2 | 3/2011 | Chu et al. |
| 7,932,106 B2 | 4/2011 | Li |
| 8,114,698 B2 * | 2/2012 | Zhong ............... H01L 33/22 257/103 |
| 9,048,378 B2 * | 6/2015 | Shatalov ............. H01L 33/20 |
| 9,142,741 B2 | 9/2015 | Shatalov et al. |
| 2002/0123164 A1 | 9/2002 | Slater, Jr. et al. |
| 2003/0132445 A1 | 7/2003 | Yoshitake et al. |
| 2004/0012958 A1 | 1/2004 | Hashimoto et al. |
| 2005/0221521 A1 | 10/2005 | Lee et al. |
| 2006/0091412 A1 | 5/2006 | Wheatley et al. |
| 2006/0186424 A1 | 8/2006 | Fujimoto et al. |
| 2006/0204865 A1 * | 9/2006 | Erchak ............... H01L 33/20 430/7 |
| 2006/0270074 A1 | 11/2006 | Kim |
| 2007/0018187 A1 | 1/2007 | Lee et al. |
| 2007/0108459 A1 | 5/2007 | Lu |
| 2007/0134834 A1 | 6/2007 | Lee et al. |
| 2008/0012034 A1 | 1/2008 | Thielen et al. |
| 2008/0277686 A1 | 11/2008 | Tsai |
| 2009/0159871 A1 | 6/2009 | Lee et al. |
| 2009/0159907 A1 | 6/2009 | Wang |
| 2009/0166666 A1 | 7/2009 | Yao et al. |
| 2009/0242913 A1 | 10/2009 | Kim et al. |
| 2009/0302429 A1 | 12/2009 | Plossl et al. |
| 2009/0315055 A1 | 12/2009 | Tamboli et al. |
| 2009/0323330 A1 | 12/2009 | Gordin et al. |
| 2010/0019263 A1 | 1/2010 | Yeh et al. |
| 2010/0038664 A1 | 2/2010 | Strauss |
| 2010/0117070 A1 | 5/2010 | Adekore et al. |
| 2010/0136728 A1 | 6/2010 | Horng et al. |
| 2010/0283065 A1 | 11/2010 | Yen |
| 2011/0024783 A1 | 2/2011 | Horng et al. |
| 2011/0215290 A1 | 9/2011 | Choi et al. |
| 2014/0312373 A1 | 10/2014 | Donofrio |
| 2015/0228855 A1 | 8/2015 | Shatalov et al. |

FOREIGN PATENT DOCUMENTS

| | | |
|---|---|---|
| JP | 2010129596 A | 6/2010 |
| KR | 100661602 B1 | 12/2006 |
| KR | 1020080006207 A | 1/2008 |
| WO | 2006096767 A1 | 9/2006 |

OTHER PUBLICATIONS

Alam, M., U.S. Appl. No. 13/517,711, Notice of Allowance, May 22, 2015, 29 pages.

Alam, M., U.S. Appl. No. 13/517,711, Notice of Allowance, Feb. 2, 2015, 30 pages.

Alam, M., U.S. Appl. No. 13/517,711, Final Office Action 1, Jul. 9, 2014, 22 pages.

Alam, M., U.S. Appl. No. 13/517,711, Office Action 1, Dec. 17, 2013, 34 pages.

Alam, M., U.S. Appl. No. 14/297,656, Office Action 1, Jul. 20, 2015, 43 pages.

Office Action for Taiwan Application No. 101121634 with English translation of search report and machine translation of office action, 18 pages, Oct. 30, 2014.

Adams, Supplementatry European Search Report for European Application No. 12801261.4, Oct. 9, 2014, 10 pages.

Kim, International Search Report and Written Opinion for International Application No. PCT/US2012/042555, Jan. 17, 2013, 9 pages.

Huh, "Improved light-output and electrical performance of InGaN-based light-emitting diode by microroughening of the p-GaN surface", Mar. 17, 2014 with 4 pages.

Abouelsaood, Ahmed A., "Modeling light scattering from mesoporous silicon", J. Appl. Phys. vol. 91, No. 5, Mar. 1, 2002, pp. 2753-2759.

Adams, Richards, Application No. 12799758.3, Supplementary Search Report, Sep. 30, 2014, 8 pages.

Chen et al., "Improvement in Light Extraction Efficiency of High Brightness InGaN-Based Light Emitting Diodes", Proc. of SPIE, vol. 7216, pp. 1-10.

Fujii et al., "Increase in the extraction efficiency of GaN-based light-emitting diodes via surface roughening", Applied Physics Letters, vol. 84, No. 6, Feb. 9, 2004, 4 pgs.

Ghannam et al., "A semiquantitative model of a porous silicon layer used as a light di!user in a thin film solar cell", Solar Energy Materials & Solar Cells 60 (2000), Jul. 1, 1998, pp. 105-125.

Ishiguro et al., "Solar Light Absorption Property of Sputtered Al—N Films with Enhanced Surface Roughness during Film Growth", Jpn. J. Appl. Phys., vol. 41, Jan. 2002, pp. 292-300.

Kawato et al., "Multiple scattering of light in porous glass", Physical Review B, vol. 49, No. 1, Jan. 1, 1994, pp. 90-94.

Papa et al., "Investigation of surface roughness on etched glass surfaces", Thin Solid Films 519, 2011, pp. 2903-2906.

Park, International Search Report and Written Opinion for PCT/US2012/042646, Dec. 27, 2012, 9 pages.

Ritchie et al., "Applications of thin graded-index films to solar absorbers", Applied Optics / vol. 16, No. 5 / May 1977, pp. 1438-1443.

Striemer et al., "Dynamic etching of silicon for broadband antireflection applications", Applied Physics Letters, vol. 81, No. 16, Oct. 14, 2002, pp. 2980-2982.

Windisch et al., "Light-Extraction Mechanisms in High-Efficiency Surface-Textured Light-Emitting Diodes", IEEE Journal on Selected Topics in Quantum Electronics, vol. 8, No. 2, Mar./Apr. 2002, pp. 248-255.

Yamada et al., "InGaN-Based Near-Ultraviolet and Blue-Light-Emitting Diodes with High External Quantum Efficiency Using a Patterned Sapphire Substrate and a Mesh Electrode", Jpn. J. Appl. Phys., vol. 41, Dec. 15, 2002, Pt. 2, No. 12B, pp. L1431-L1433.

Miyoshi, Jesse Y., U.S. Appl. No. 13/524,350, Notice of Allowance, Jan. 27, 2015, 12 pages.

Miyoshi, Jesse Y., U.S. Appl. No. 13/524,350, Notice of Allowance, Oct. 24, 2014, 10 pages.

(56) References Cited

OTHER PUBLICATIONS

Miyoshi, Jesse Y., U.S. Appl. No. 13/524,350, Office Action 1, Jul. 1, 2014, 18 pages.
Alam, M., U.S. Appl. No. 15/149,782, Office Action 1, dated Apr. 14, 2017, 38 pages.

* cited by examiner

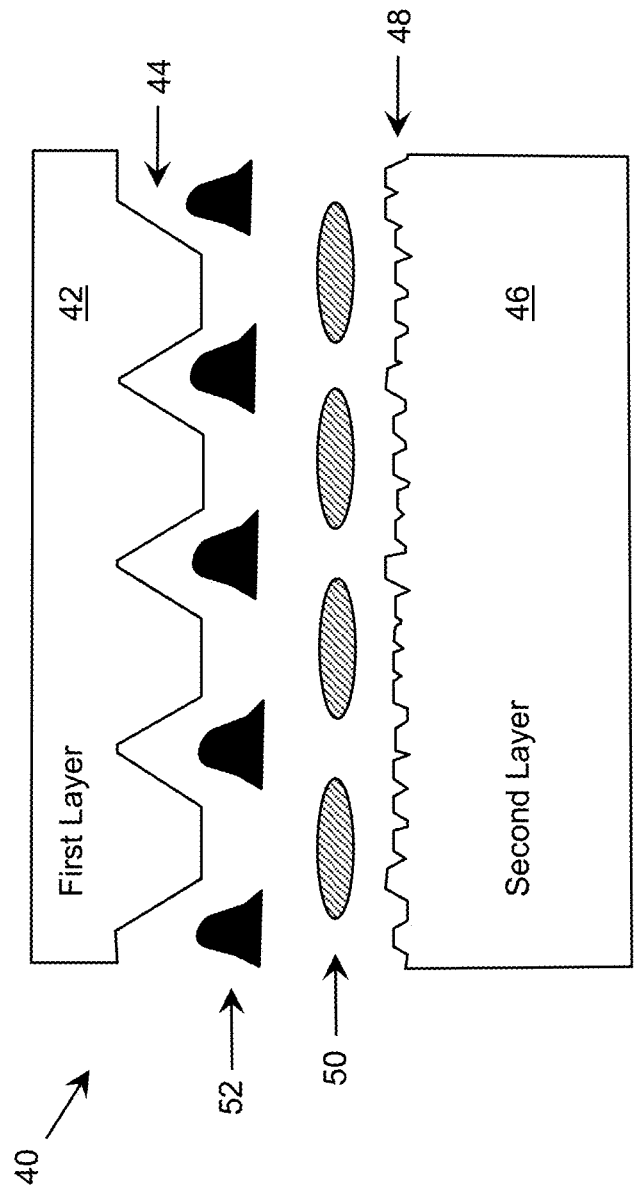

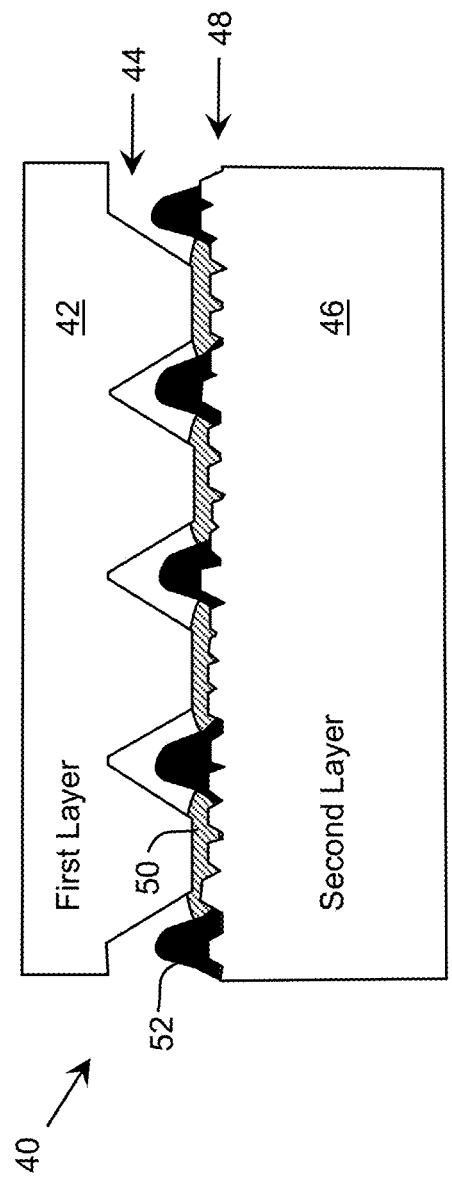

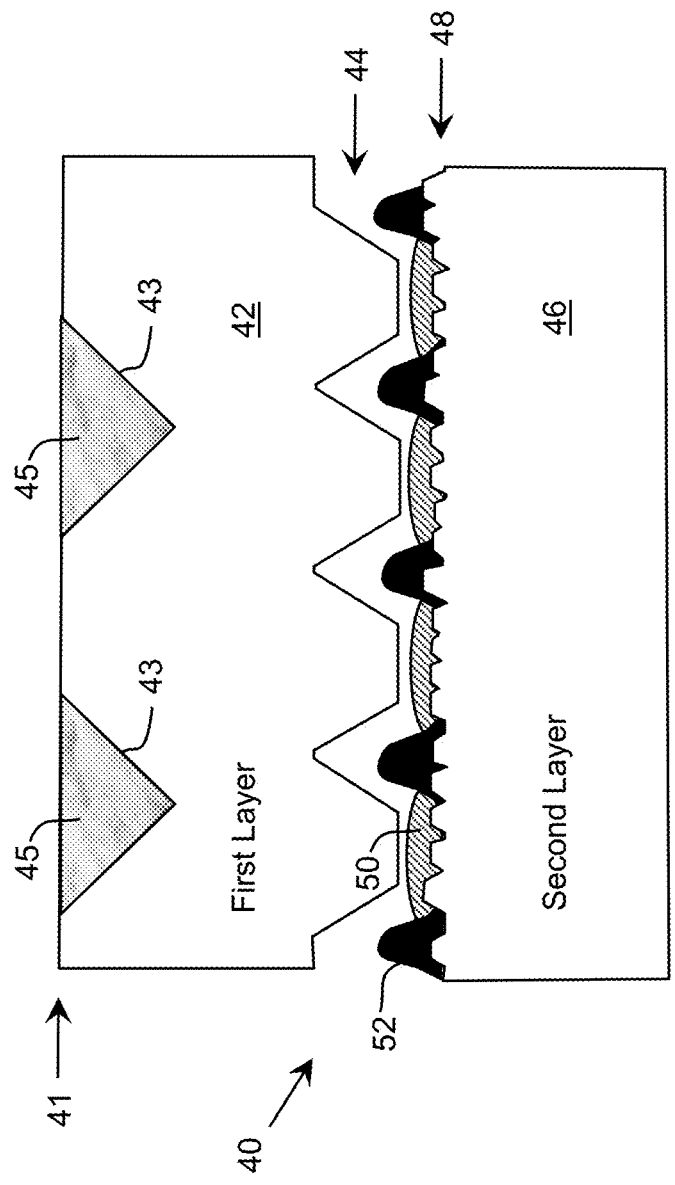

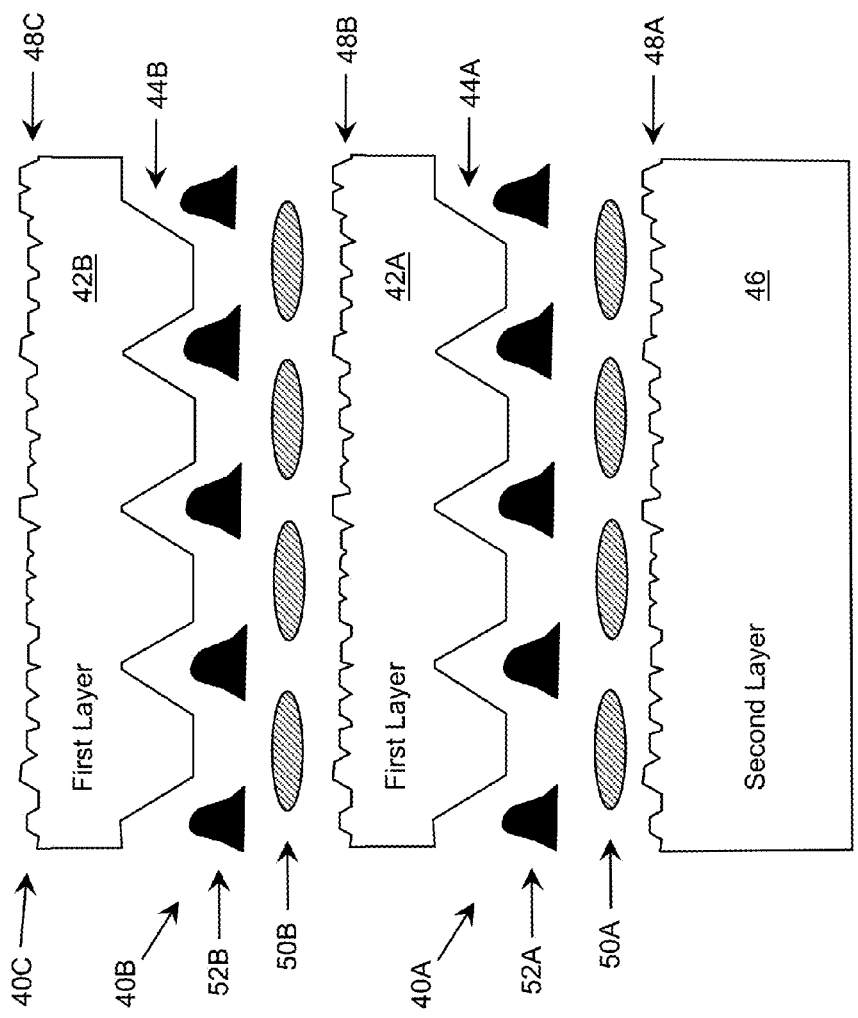

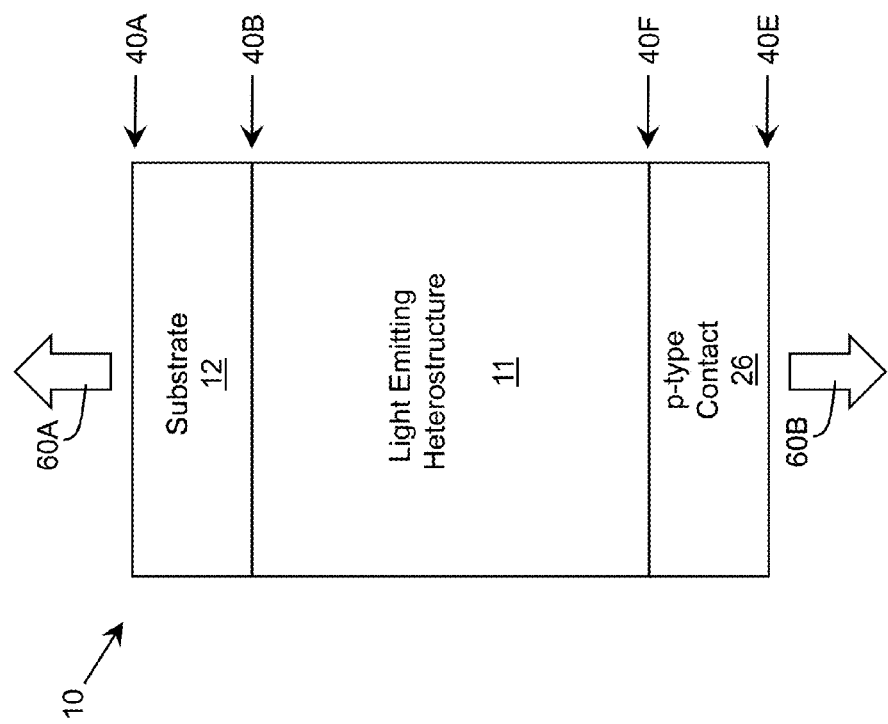

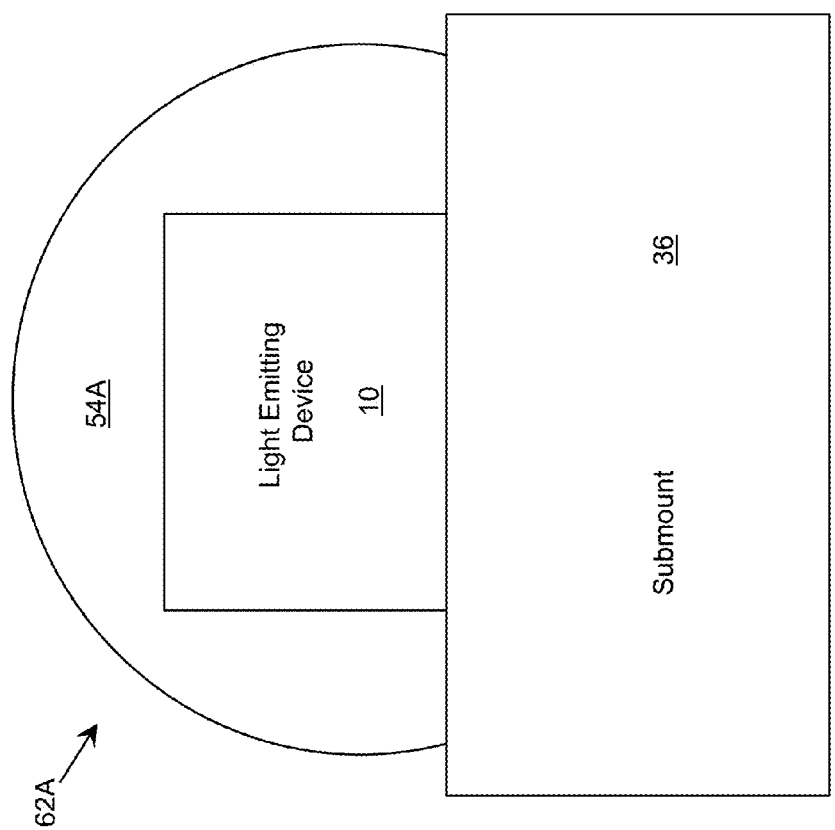

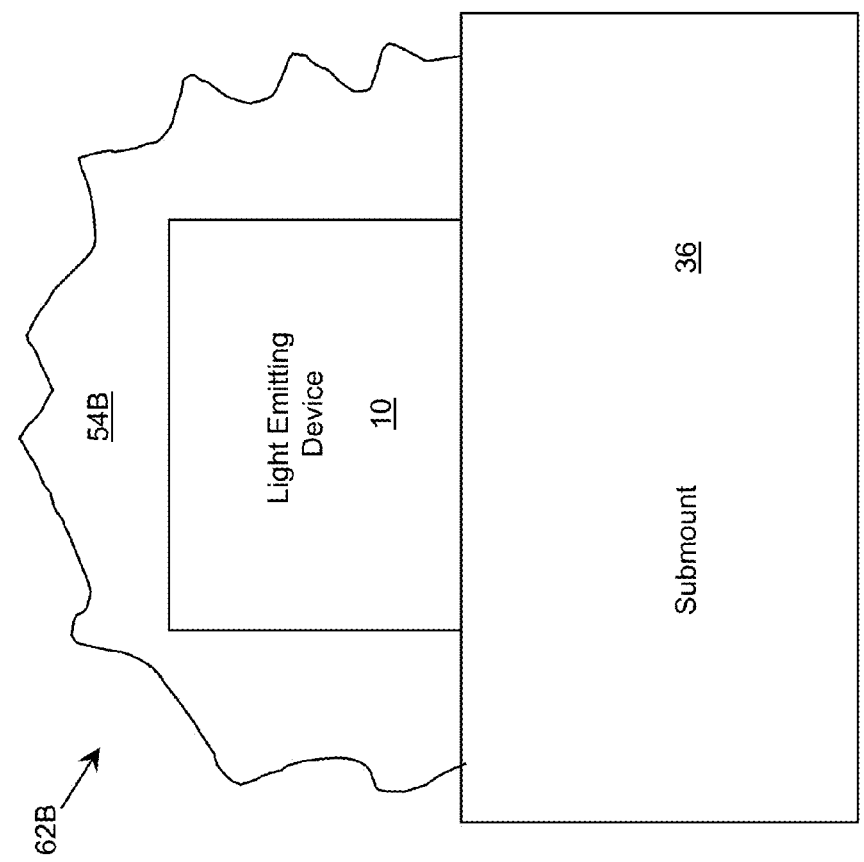

DEVICE WITH INVERTED LARGE SCALE LIGHT EXTRACTION STRUCTURES

REFERENCE TO RELATED APPLICATIONS

The current application is a continuation-in-part of U.S. patent application Ser. No. 13/524,350, which was filed on 15 Jun. 2012, and which claims the benefit of U.S. Provisional Application No. 61/497,489, titled "Light Emitting Diodes with Improved Extraction," which was filed on 15 Jun. 2011, and U.S. Provisional Application No. 61/510,603, titled "Light Emitting Diodes with Inverted Large Scale Extraction Structures," which was filed on 22 Jul. 2011, all of which are hereby incorporated by reference.

GOVERNMENT LICENSE RIGHTS

This invention was made with Federal government support under Contract No. W911NF-10-2-0023 awarded by Defense Advanced Research Projects Agency (DARPA). The government has certain rights in the invention.

TECHNICAL FIELD

The disclosure relates generally to emitting devices, and more particularly, to an emitting device with improved light extraction.

BACKGROUND ART

Semiconductor emitting devices, such as light emitting diodes (LEDs) and laser diodes (LDs), include solid state emitting devices composed of group III-V semiconductors. A subset of group III-V semiconductors includes group III nitride alloys, which can include binary, ternary and quaternary alloys of indium (In), aluminum (Al), gallium (Ga), and nitrogen (N). Illustrative group III nitride based LEDs and LDs can be of the form $In_yAl_xGa_{1-x-y}N$, where x and y indicate the molar fraction of a given element, $0 \le x, y \le 1$, and $0 \le x+y \le 1$. Other illustrative group III nitride based LEDs and LDs are based on boron (B) nitride (BN) and can be of the form $Ga_zIn_yAl_xB_{1-x-y-z}N$, where $0 \le x, y, z \le 1$, and $0 \le x+y+z \le 1$.

An LED is typically composed of semiconducting layers. During operation of the LED, an applied bias across doped layers leads to injection of electrons and holes into an active layer where electron-hole recombination leads to light generation. Light is generated with uniform angular distribution and escapes the LED die by traversing semiconductor layers in all directions. Each semiconducting layer has a particular combination of molar fractions (e.g., x, y, and z) for the various elements, which influences the optical properties of the layer. In particular, the refractive index and absorption characteristics of a layer are sensitive to the molar fractions of the semiconductor alloy.

An interface between two layers is defined as a semiconductor heterojunction. At an interface, the combination of molar fractions is assumed to change by a discrete amount. A layer in which the combination of molar fractions changes continuously is said to be graded. Changes in molar fractions of semiconductor alloys can allow for band gap control, but can lead to abrupt changes in the optical properties of the materials and result in light trapping. A larger change in the index of refraction between the layers, and between the substrate and its surroundings, results in a smaller total internal reflection (TIR) angle (provided that light travels from a high refractive index material to a material with a lower refractive index). A small TIR angle results in a large fraction of light rays reflecting from the interface boundaries, thereby leading to light trapping and subsequent absorption by layers or LED metal contacts.

Roughness at an interface allows for partial alleviation of the light trapping by providing additional surfaces through which light can escape without totally internally reflecting from the interface. Nevertheless, light only can be partially transmitted through the interface, even if it does not undergo TIR, due to Fresnel losses. Fresnel losses are associated with light partially reflected at the interface for all the incident light angles. Optical properties of the materials on each side of the interface determines the magnitude of Fresnel losses, which can be a significant fraction of the transmitted light.

SUMMARY OF THE INVENTION

Aspects of the invention provide an interface including roughness components for improving the propagation of radiation through the interface. The interface includes a first profiled surface of a first layer comprising a set of large roughness components providing a first variation of the first profiled surface having a first characteristic scale and a second profiled surface of a second layer comprising a set of small roughness components providing a second variation of the second profiled surface having a second characteristic scale. The first characteristic scale is approximately an order of magnitude larger than the second characteristic scale. The surfaces can be bonded together using a bonding material, and a filler material also can be present in the interface.

A first aspect of the invention provides a device comprising: a first at least partially transparent layer having a first profiled surface, wherein the first profiled surface comprises a set of large roughness components providing a first variation of the first profiled surface having a first characteristic scale; and a second at least partially transparent layer having a second profiled surface adjacent to the first profiled surface, wherein the second profiled surface comprises a set of small roughness components providing a second variation of the second profiled surface having a second characteristic scale, and wherein the first characteristic scale is approximately an order of magnitude larger than the second characteristic scale.

A second aspect of the invention provides a method comprising: designing an interface between first and second at least partially transparent layers, wherein the interface includes: a first profiled surface of the first at least partially transparent layer, wherein the first profiled surface comprises a set of large roughness components providing a first variation of the first profiled surface having a first characteristic scale; and a second profiled surface of the second at least partially transparent layer adjacent to the first profiled surface, wherein the second profiled surface comprises a set of small roughness components providing a second variation of the second profiled surface having a second characteristic scale, and wherein the first characteristic scale is approximately an order of magnitude larger than the second characteristic scale.

A third aspect of the invention provides an emitting device comprising: an active region configured to generate radiation; a first at least partially transparent layer having a first profiled surface, wherein the first profiled surface comprises a set of large roughness components providing a first variation of the first profiled surface having a first characteristic scale; and a second at least partially transparent layer having a second profiled surface adjacent to the first profiled surface, wherein the second profiled surface comprises a set of small roughness components providing a second variation of the second profiled surface having a second characteristic scale, wherein the first characteristic scale is approximately an order of magnitude larger than the second characteristic scale, and wherein radiation generated by the active region passes through the second at least partially transparent layer before entering the first at least partially transparent layer.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIG. 2 shows an exploded view of an illustrative interface according to an embodiment.

FIG. 3 shows a schematic of an illustrative interface according to an embodiment.

FIG. 5 shows an illustrative series of interfaces according to an embodiment.

FIG. 6 shows an illustrative first layer including two interfaces configured to affect the propagation of radiation there through according to an embodiment.

FIG. 7 shows an illustrative device according to another embodiment.

FIGS. 8A and 8B show illustrative device packages according to embodiments.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide an interface including roughness components for improving the propagation of radiation through the interface. The interface includes a first profiled surface of a first layer comprising a set of large roughness components providing a first variation of the first profiled surface having a first characteristic scale and a second profiled surface of a second layer comprising a set of small roughness components providing a second variation of the second profiled surface having a second characteristic scale. The first characteristic scale is approximately an order of magnitude larger than the second characteristic scale. The surfaces can be bonded together using a bonding material, and a filler material also can be present in the interface. The large and small roughness components can provide additional surfaces for reflecting and refracting light and facilitate light extraction through the interface. As used herein, unless otherwise noted, the term "set" means one or more (i.e., at least one) and the phrase "any solution" means any now known or later developed solution.

Figure 1:
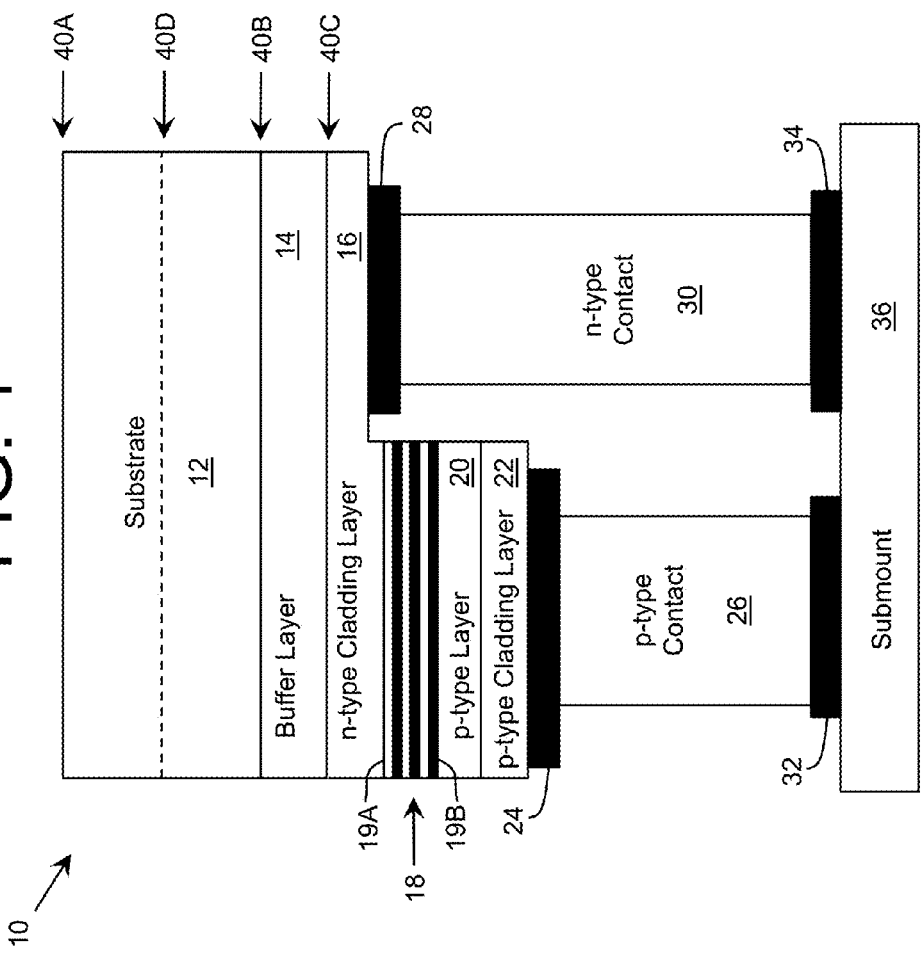
FIG. 1 shows a schematic structure of an illustrative emitting device according to an embodiment.

Turning to the drawings, FIG. 1 shows a schematic structure of an illustrative emitting device 10 according to an embodiment. In a more particular embodiment, the emitting device 10 is configured to operate as a light emitting diode (LED), such as a conventional or super luminescent LED. Alternatively, the emitting device 10 can be configured to operate as a laser diode (LD). In either case, during operation of the emitting device 10, application of a bias comparable to the band gap results in the emission of electromagnetic radiation from an active region 18 of the emitting device 10. The electromagnetic radiation emitted by the emitting device 10 can comprise a peak wavelength within any range of wavelengths, including visible light, ultraviolet radiation, deep ultraviolet radiation, infrared light, and/or the like.

The emitting device 10 includes a heterostructure comprising a substrate 12, a buffer layer 14 adjacent to the substrate 12, an n-type cladding layer 16 (e.g., an electron supply layer) adjacent to the buffer layer 14, and an active region 18 having an n-type side 19A adjacent to the n-type cladding layer 16. Furthermore, the heterostructure of the emitting device 10 includes a p-type layer 20 (e.g., an electron blocking layer) adjacent to a p-type side 19B of the active region 18 and a p-type cladding layer 22 (e.g., a hole supply layer) adjacent to the p-type layer 20.

In a more particular illustrative embodiment, the emitting device 10 is a group III-V materials based device, in which some or all of the various layers are formed of elements selected from the group III-V materials system. In a still more particular illustrative embodiment, the various layers of the emitting device 10 are formed of group III nitride based materials. Group III nitride materials comprise one or more group III elements (e.g., boron (B), aluminum (Al), gallium (Ga), and indium (In)) and nitrogen (N), such that $B_WAl_XGa_YIn_ZN$, where $0 \leq W, X, Y, Z \leq 1$, and $W+X+Y+Z=1$. Illustrative group III nitride materials include AlN, GaN, InN, BN, AlGaN, AlInN, AlBN, AlGaInN, AlGaBN, AlInBN, and AlGaInBN with any molar fraction of group III elements.

An illustrative embodiment of a group III nitride based emitting device 10 includes an active region 18 (e.g., a series of alternating quantum wells and barriers) composed of $In_yAl_xGa_{1-x-y}N$, $Ga_zIn_yAl_xB_{1-x-y-z}N$, an $Al_xGa_{1-x}N$ semiconductor alloy, or the like. Similarly, both the n-type cladding layer 16 and the p-type layer 20 can be composed of an $In_yAl_xGa_{1-x-y}N$ alloy, a $Ga_zIn_yAl_xB_{1-x-y-z}N$ alloy, or the like. The molar fractions given by x, y, and z can vary between the various layers 16, 18, and 20. The substrate 12 can be sapphire, silicon carbide (SiC), silicon (Si), GaN, AlGaN, AlON, LiGaO$_2$, or another suitable material, and the buffer layer 14 can be composed of AlN, an AlGaN/AlN superlattice, and/or the like.

As shown with respect to the emitting device 10, a p-type metal 24 can be attached to the p-type cladding layer 22 and a p-type contact 26 can be attached to the p-type metal 24. Similarly, an n-type metal 28 can be attached to the n-type cladding layer 16 and an n-type contact 30 can be attached to the n-type metal 28. The p-type metal 24 and the n-type metal 28 can form ohmic contacts to the corresponding layers 22, 16, respectively. In an embodiment, the p-type metal 24 and the n-type metal 28 each comprise several conductive and reflective metal layers, while the n-type contact 30 and the p-type contact 26 each comprise highly conductive metal. In an embodiment, the p-type cladding layer 22 and/or the p-type contact 26 can be at least partially transparent (e.g., semi-transparent or transparent) to the electromagnetic radiation generated by the active region 18.

For example, the p-type cladding layer 22 and/or the p-type contact 26 can comprise a short period superlattice lattice structure, such as an at least partially transparent magnesium (Mg)-doped AlGaN/AlGaN short period superlattice structure (SPSL). In an embodiment, an at least partially transparent p-type contact 26 can be made using a periodic metal structure with openings, which can form a photonic crystal. Furthermore, the p-type contact 26 and/or the n-type contact 30 can be at least partially reflective of the electromagnetic radiation generated by the active region 18. In another embodiment, the n-type cladding layer 16 and/or the n-type contact 30 can be formed of a short period superlattice, such as an AlGaN SPSL, which is at least partially transparent to the electromagnetic radiation generated by the active region 18.

As used herein, a layer is at least partially transparent when the layer allows at least a portion of electromagnetic radiation in a corresponding range of radiation wavelengths to pass there through. For example, a layer can be configured to be at least partially transparent to a range of radiation wavelengths corresponding to a peak emission wavelength for the light (such as ultraviolet light or deep ultraviolet light) emitted by the active region 18 (e.g., peak emission wavelength +/−five nanometers). As used herein, a layer is at least partially transparent to radiation if it allows more than approximately 0.5 percent of the radiation to pass there through. In a more particular embodiment, an at least partially transparent layer is configured to allow more than approximately five percent of the radiation to pass there through. Similarly, a layer is at least partially reflective when the layer reflects at least a portion of the relevant electromagnetic radiation (e.g., light having wavelengths close to the peak emission of the active region). In an embodiment, an at least partially reflective layer is configured to reflect at least approximately five percent of the radiation.

As further shown with respect to the emitting device 10, the device 10 can be mounted to a submount 36 via the contacts 26, 30. In this case, the substrate 12 is located on the top of the emitting device 10. To this extent, the p-type contact 26 and the n-type contact 30 can both be attached to a submount 36 via contact pads 32, 34, respectively. The submount 36 can be formed of aluminum nitride (AlN), silicon carbide (SiC), and/or the like.

Any of the various layers of the emitting device 10 can comprise a substantially uniform composition or a graded composition. For example, a layer can comprise a graded composition at a heterointerface with another layer. In an embodiment, the p-type layer 20 comprises a p-type blocking layer having a graded composition. The graded composition(s) can be included to, for example, reduce stress, improve carrier injection, and/or the like. Similarly, a layer can comprise a superlattice including a plurality of periods, which can be configured to reduce stress, and/or the like. In this case, the composition and/or width of each period can vary periodically or aperiodically from period to period.

It is understood that the layer configuration of the emitting device 10 described herein is only illustrative. To this extent, an emitting device/heterostructure can include an alternative layer configuration, one or more additional layers, and/or the like. As a result, while the various layers are shown immediately adjacent to one another (e.g., contacting one another), it is understood that one or more intermediate layers can be present in an emitting device/heterostructure. For example, an illustrative emitting device/heterostructure can include an undoped layer between the active region 18 and one or both of the p-type cladding layer 22 and the electron supply layer 16.

Furthermore, an emitting device/heterostructure can include a Distributive Bragg Reflector (DBR) structure, which can be configured to reflect light of particular wavelength(s), such as those emitted by the active region 18, thereby enhancing the output power of the device/heterostructure. For example, the DBR structure can be located between the p-type cladding layer 22 and the active region 18. Similarly, a device/heterostructure can include a p-type layer located between the p-type cladding layer 22 and the active region 18. The DBR structure and/or the p-type layer can comprise any composition based on a desired wavelength of the light generated by the device/heterostructure. In one embodiment, the DBR structure comprises a Mg, Mn, Be, or Mg+Si-doped p-type composition. The p-type layer can comprise a p-type AlGaN, AlInGaN, and/or the like. It is understood that a device/heterostructure can include both the DBR structure and the p-type layer (which can be located between the DBR structure and the p-type cladding layer 22) or can include only one of the DBR structure or the p-type layer. In an embodiment, the p-type layer can be included in the device/heterostructure in place of an electron blocking layer. In another embodiment, the p-type layer can be included between the p-type cladding layer 22 and the electron blocking layer.

Regardless, the device 10 can include one or more at least partially reflective layers on a first side of the active region 18 and one or more at least partially transparent layers on an opposing side of the active region 18 through which radiation generated in the active region 18 can leave the device 10. In an embodiment, an interface, such as one or more of the interfaces 40B, 40C, between two adjacent layers and/or an interface 40A between a layer, such as the substrate 12, and the surrounding environment, can include a profiled surface that is uneven or rough rather than substantially smooth. The profiled surface can be configured to improve the propagation of radiation through the interface 40A-40C.

Furthermore, a relatively thick layer in a heterostructure, such as the substrate 12, can include an interface 40D having a profiled surface embedded therein to facilitate the propagation of radiation through the layer. In particular, the profiled surface can be configured to increase an amount of radiation propagating in directions close to the normal to the interface 40D. In an embodiment, the interface 40D has a thickness greater than a target wavelength of the radiation. In general, the interface 40D can be located anywhere within the layer (e.g., the substrate 12). In an embodiment, the interface 40D is located a distance of at least two times the target wavelength of the radiation from the ends of the layer (e.g., interfaces 40A and 40B).

An interface 40A-40D having a profiled surface can be included, for example, at an interface between two or more materials where the refractive index differs by a significant amount (e.g., a difference in refractive indexes greater than or equal to approximately five percent). For example, as described herein, the substrate 12 can be made of sapphire, the buffer layer 14 can be AlN, and the cladding layer 14 can be AlGaN. For an illustrative target wavelength of radiation, these materials can have indexes of refraction of 1.8, 2.3, and 2.5, respectively. To this extent, the device 10 can include a profiled surface: at the interface 40A between the substrate 12 and the environment (which has an index of refraction of approximately one); at the interface 40B between the buffer layer 14 and the substrate 12; and/or at the interface 40C between the n-type cladding layer 16 and the buffer layer 14. In this case, the buffer layer 14 can act as a light extraction film inserted between two materials with two different refraction indexes to provide a more gradual transition of refraction indexes.

It is understood that various embodiments of the device 10 can include a profiled surface configured as described herein at any combination of one or more interfaces. To this extent, a profiled surface can be included on any type of group III-nitride based semiconductor surface, such as AlInGaN or AlBGaN semiconductor alloys. Furthermore, a profiled surface can be included, for example, on an ultraviolet transparent glass, a polymer with a matched index deposited over a group III-nitride based semiconductor surface, and/or the like.

Each profiled surface can be configured to improve the extraction of radiation from a corresponding at least partially transparent layer 12, 14, 16, respectively. For example, during operation of the device 10, radiation can be generated in the active region 18 and travel through the at least partially transparent layers 16, 14, 12, before being emitted from the device 10. The interfaces 40C, 40B can be profiled to increase the amount of radiation that exits a first layer 16, 14 and enters an adjacent layer 14, 12, respectively, as compared to a device having substantially smooth interfaces 40C, 40B between the layers 12, 14, 16. Similarly, the interface 40A can be configured to increase the amount of radiation that exits the device 10, e.g., via substrate 12, and enters into the surrounding environment, as compared to a device having a substantially smooth outer surface. Furthermore, the interface 40D can be configured to increase the amount of radiation that propagates through the entire substrate 12 as compared to a substrate without such an interface 40D.

FIG. 2 shows an exploded view of an illustrative interface 40 and FIG. 3 shows a schematic of the interface 40 according to an embodiment. Referring to FIGS. 2 and 3, a surface of a first layer 42 having a set of large roughness components 44 formed thereon is attached to a surface of a second layer 46 having a set of small roughness components 48 formed thereon. The large roughness components 44 and small roughness components 48 can be configured to provide additional surfaces for reflecting and refracting light, thereby facilitating light extraction through the interface 40. While each of the sets of roughness components 44, 48 are shown including a particular number of roughness components, it is understood that the sets of roughness components 44, 48 can include any number of roughness components having any combination of configurations.

The set of large roughness components 44 can provide variation of the profiled surface of the first layer 42 having a characteristic scale that is approximately an order of magnitude larger than the variation of the profiled surface of the second layer 46 provided by the set of small roughness components 48. In an embodiment, the large roughness components 44 provide variation of the profiled surface of the first layer 42 having a characteristic scale greater than a target wavelength. The target wavelength can be selected based on a peak wavelength of the radiation desired to pass through the interface 40 during operation of the device 10 and can be within any range of wavelengths, including visible light, ultraviolet radiation, deep ultraviolet radiation, infrared light, and/or the like. In an embodiment, the target wavelength corresponds to the peak wavelength of the radiation generated in the active region 18 (FIG. 1) of the device. In a more particular embodiment, the characteristic scale of the variation provided by the large roughness components 44 is approximately an order of magnitude (e.g., ten times) larger than the target wavelength, and can be determined based on the average height and/or width of the large roughness components 44. In an embodiment, the large roughness components 44 have comparable heights and widths, e.g., of approximately two to several tens of micrometers. Inclusion of the large roughness components 44 can reduce losses associated with TIR.

The set of small roughness components 48 is illustrated as including a series of peaks and valleys of material having random variations in heights and locations. In an embodiment, the small roughness components 48 can provide variation of the profiled surface of the second layer 46 having a characteristic scale on the order of the target wavelength. To this extent, the characteristic scale of the variation provided by the small roughness components 48 can be between approximately ten to two hundred percent of the target wavelength, and can be determined based on the average height of the small roughness components 48. In an embodiment, the small roughness components 48 have heights between approximately ten nanometers to a few microns. Inclusion of the small roughness components 48 can reduce Fresnel losses. Furthermore, the small roughness components 48 can form a photonic crystal, which is configured to guide the radiation of a target wavelength to facilitate its extraction from the second layer 46.

To form the interface 40, a bonding material 50 can be used to secure the first layer 42 to the second layer 46. The bonding material 50 can have a refractive index for a target wavelength that substantially matches the refractive index for the material of the first layer 42 and/or the second layer 46. Alternatively, the bonding material 50 can have a refractive index for the target wavelength that is between the refractive indexes for the materials of the first layer 42 and the second layer 46, thereby providing a transition between the two refractive indexes. For example, when the layers 42, 46 have different indexes of refraction, an index of refraction of the bonding material 50 can be approximately equal to a square root of a product of the indexes of refraction of the layers 42, 46. An illustrative bonding material 50 comprises a cured polymer film, or the like.

As illustrated, the set of large roughness components 44 can comprise a plurality of shapes, each of which has a truncated triangular cross-section, which can correspond to a truncated cone or a truncated pyramid having any number of sides. When incorporated into a device, such as the device 10 (FIG. 1), radiation will propagate (e.g., in a generally upward direction in FIGS. 2 and 3) through the second layer 46, across the interface 40, and through the first layer 42. As a result, each large roughness component 44 can be an inverse truncated element, where the end of the large roughness component 44 where the radiation enters (e.g., the base) is smaller than the end of the large roughness component 44 where the radiation exits (e.g., the top). To this extent, a filler material 52 can be located between the first layer 42 and the second layer 46 between to fill in the gaps between the smaller ends of the large roughness components 44. As illustrated, the filler material 52 can be located on the second layer 46 and only fill a portion of the spacing present between the large roughness components 44. The filler material 52 can be at least partially transparent to radiation of the target wavelength and have an irregular shape to facilitate the propagation of radiation through the interface 40. In an embodiment, the filler material 52 can be the same material as the bonding material 50. Alternatively, the filler material 52 can be a material that is more transparent than the bonding material 50. In an embodiment, the filler material 52 can have an index of refraction approximately equal to a square root of a product of the indexes of refraction of the layers 42, 46. An illustrative filler material 52 comprises a cured polymer film, or the like.

Figure 4B:
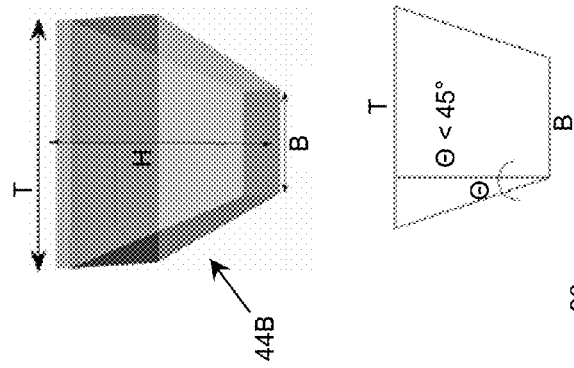
FIGS. 4A-4C show illustrative large roughness components and a corresponding illustrative polar plot of intensity according to embodiments.
Figure 4C:
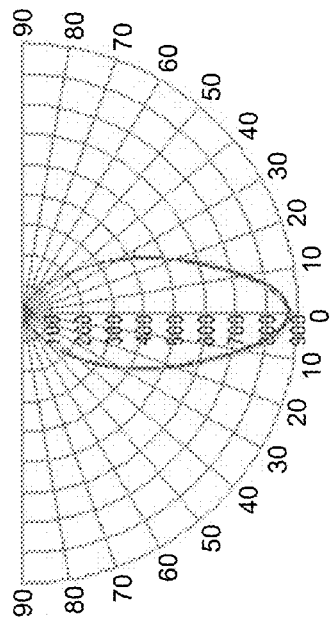
Figure 4A:
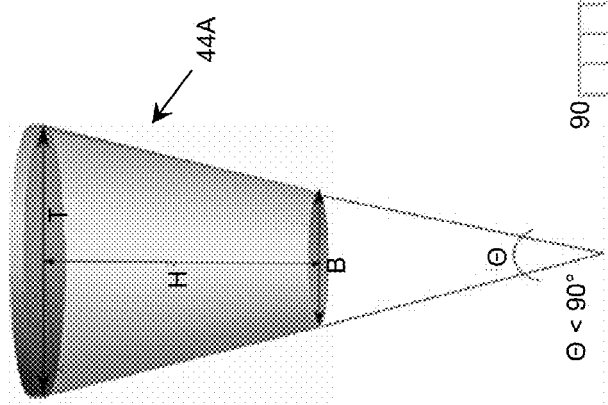

FIGS. 4A-4C show illustrative large roughness components 44A, 44B and a corresponding illustrative polar plot of intensity, respectively, according to embodiments. In FIG. 4A, the large roughness component 44A is in the shape of a truncated cone, while the large roughness component 44B of FIG. 4B is in the shape of a truncated pyramid. Each large roughness component 44A, 44B can comprise an inverse truncated element, where the base B, which is the end of the large roughness component 44A, 44B into which most of the radiation will enter, is smaller than the top T, which is the end of the large roughness component 44A, 44B through which radiation is desired to exit. While the truncated pyramid of the large roughness component 44B is shown having a base and top with four sides, it is understood that the base and top of the pyramid can be a polygon with any number of sides.

Such a configuration for the large roughness components 44A, 44B can be used, for example, for light focusing in order to facilitate extraction of light from the interface 40 (FIGS. 2 and 3), e.g., by designing the large roughness components 44A, 44B to determine an emission cone angle for radiation of the target wavelength. To this extent, the sides of the truncated cone shape of the large roughness component 44A can form an angle Θ of less than ninety degrees. Similarly, the sides of the truncated pyramid shape of the large roughness component 44B and the sides of the truncated cone shape of the large roughness component 44A can form an angle with respect to the normal of less than forty-five degrees. In this manner, an increased amount of light reflections will result in the light being directed out from the interface 40. FIG. 4C shows an illustrative polar plot of intensity distribution for the large roughness component 44A.

Each of the interfaces described herein can be independently configured to improve the propagation of radiation there through. FIG. 5 shows an illustrative series of interfaces 40A-40C according to an embodiment. As shown, a first layer 42A, 42B can include an interface 40B embedded therein. The second layer 46 can comprise the same material as the first layer 42A, 42B or a different material. In an illustrative embodiment, the layers 42A, 42B, 46 are all sapphire. However, it is understood that one or more of the layers 42A, 42B, 46 can be formed of a semiconductor material.

Regardless, it is understood that various attributes of each interface 40A-40C can be configured differently from the corresponding attributes of the other interfaces 40A-40C. For example, the sets of small roughness components 48A-48C can include two or more of: rough variations; variations forming a photonic crystal; a flat surface; and/or the like. Similarly, the sets of large roughness components 44A, 44B can be configured differently from one another. Additionally, the bonding materials 50A, 50B and/or filler materials 52A, 52B can be the same materials, different materials, and/or the like. Selection of a desired configuration for each of the interfaces 40A-40C can be performed using numerical simulation, through experimentation, and/or the like. In an embodiment, the numerical simulation uses a genetic algorithm to arrive at a desired configuration or combination of configurations of the interfaces 40A-40C.

In addition to inclusion of one or more interfaces 40 with profiled surfaces as described herein, an interface can include another configuration for affecting the propagation of radiation there through. For example, FIG. 6 shows an illustrative first layer 42 (e.g., a substrate 12) including two interfaces 40, 41 configured to affect the propagation of radiation there through according to an embodiment. In this case, the interface 40 can be configured as described herein, while the interface 41 can include a set of cavities 43, each of which can be filled with a fluid 45. In this case, the fluid 45 can be selected to provide better index matching at the interface 41 between the material of the first layer 42 and an adjacent material (e.g., atmospheric air). In an illustrative embodiment, the fluid 45 is water.

Returning to FIG. 1, while primarily shown and described in conjunction with interfaces 40A-40D including profiled surfaces present on the n-type side of an active region 18 in the device heterostructure, it is understood that an embodiment can include one or more interfaces with profiled surfaces located on the p-type side of the active region 18.

To this extent, FIG. 7 shows an illustrative device 10 according to another embodiment. In this case, the device 10 includes a light emitting heterostructure 11, which can include a configuration of layers, such as the layers shown in FIG. 1, configured to generate radiation as described herein. The device 10 can be configured such that the radiation is emitted from both ends of the device 10. To this extent, radiation 60A can be emitted through an at least partially transparent substrate 12 located on a first end of the heterostructure 11, and radiation 60B can be emitted through an at least partially transparent p-type contact 26 located on the opposite end of the heterostructure 11 from the substrate 12. In an alternative embodiment, an at least partially transparent n-type contact 30 (FIG. 1) can be located opposite the p-type contact 26, e.g., instead of the substrate 12. Alternatively, the p-type contact 26 and n-type contact 30 can be configured similarly to the configuration shown in FIG. 1, in which both contacts 26, 30 are located on the same side of the device 10 with the p-type contact 26 attached to a mesa structure including the active region 18 (FIG. 1).

An at least partially transparent contact, such as the p-type contact 26 can be fabricated using any solution. For example, such a contact can be fabricated by including a set of openings within structure (e.g., layers) of the contact. In this case, radiation can propagate through the openings in the contact. Furthermore, partially transparent conductive oxides, such as indium tin oxide (ITO), doped $Ga_2O_3$, and/or the like, can be used to serve as partially UV transparent contact material. It is understand that an embodiment can include a combination of a set of openings with some of the areas covered by partially transparent conductive oxide. Still other approaches include using few layered or monolayer graphene as a conductive spreading layer. In this case, the graphene can be placed within the opening(s) of the contact structure.

Furthermore, the p-type contact 26 can include one or more interfaces, such as the interfaces 40E, 40F, configured to improve the propagation of radiation there through. To this extent, the interfaces 40E, 40F can be configured to improve extraction of the radiation 60B from the p-type side of the heterostructure 11 and through the contact 26. For example, the interface 40E can be fabricated and configured similar to the interface 40A shown and described in conjunction with the substrate 12, and the interface 40F can be fabricated and configured similar to the interface 40B shown and described in conjunction with the substrate 12. Additionally, it is understood that additional interfaces on the p-type side of the device heterostructure 11 can be configured to improve the propagation of radiation there through. For example, an interface between the p-type layer 20 (FIG. 1) and the p-type cladding layer 22 (FIG. 1) can be configured similar to the interface 40B.

In addition to the interfaces 40A-40F, 41 described herein, it is understood that one or more additional features can be included to improve the propagation of radiation through an interface. For example, FIGS. 8A and 8B show illustrative device packages 62A, 62B according to embodiments. In each case, a light emitting device 10 described herein is mounted to a submount 36 (e.g., in the flip-chip configuration shown in FIG. 1). Furthermore, the device 10 is encapsulated by an encapsulant 54A, 54B. The encapsulant 54A, 54B can comprise any type of encapsulating material, such as fluoropolymers. The fluoropolymers can include a copolymer of ethylene and tetrafluoroethylene of the formula $[(CF_2\text{-}CF_2)_x\text{—}(CH_2\text{-}CH_2)_y]_n|$ known as ETFE, a copolymer of ethylene, tetrafluoroethylene, and hexafluoropropylene with the formula $[(CH_2\text{—}CH_2)_x(CF_2\text{—}CF_2)_y(CF(CF_3)\text{—}CF_2)_z]n$ known as EFEP, polytetrafluoroethylene (PTFE, such as Teflon) film, or similar fluoropolymer. Inclusion of the encapsulant 54A, 54B can improve extraction of radiation from the device 10, e.g., by providing an intermediate refractive index between the refractive indexes of the device 10 (e.g., the substrate 12 shown in FIG. 1) and the environment (e.g., atmospheric air).

As shown in FIG. 8A, the encapsulant 54A can be have a curved outer surface, which can act as a lens for the radiation passing there through. Alternatively, as shown in FIG. 8B, an outer surface 56 of the encapsulant 54B can be profiled. In an embodiment, the profiled outer surface 56 is synergistic with a profiled surface of the device 10, such as the interface 40A shown in FIG. 1. In general, a synergistic profiled outer surface 56 means an encapsulant shape that improves an overall light extraction efficiency, as compared to a device 10 having no encapsulant or an encapsulant having shapes that are not conducive for optimal performance. For example, the profiled surfaces 40A, 56 can be configured to have a cooperative affect in which the respective profiled surfaces 40A, 56 increase the overall extraction of radiation from the device as compared to inclusion of only one of the profiled surfaces 40A, 56. Such an effect can be determined, for example, using numerical simulation, experimentation, and/or the like. In an embodiment, the outer surface 56 of the encapsulant 54B includes a set of large roughness components having shapes similar to that of the large roughness components 44A or 44B shown in FIGS. 4A and 4B.

Returning to FIG. 1, it is understood that a device 10, or a heterostructure used in forming a device 10, including one or more interfaces 40A-40D having a profiled surface can be fabricated using any solution. For example, an emitting device/heterostructure can be manufactured by obtaining (e.g., forming, preparing, acquiring, and/or the like) a substrate 12, forming (e.g., growing, depositing, adhering, and/or the like) a buffer layer 14 thereon, and forming an n-type cladding layer 16 over the buffer layer 14. Furthermore, the active region 18, e.g., including quantum wells and barriers, can be formed over the n-type cladding layer 16 using any solution. The p-type layer 20 can be formed over the active region 18 and the p-type cladding layer 22 can be formed on the p-type layer 20 using any solution. Additionally, one or more metal layers, contacts, and/or additional layers can be formed using any solution. Furthermore, the heterostructure/device can be attached to a submount via contact pads. It is understood that the fabrication of the emitting device/heterostructure can include the deposition and removal of a temporary layer, such as mask layer, the patterning one or more layers, the formation of one or more additional layers not shown, and/or the like.

In an embodiment, fabrication of the device 10 includes forming an interface 40A-40D having a profiled surface using any combination of deposition and/or etching. For example, referring to FIG. 2, the layers 42, 46 can be obtained using any solution. For example, the respective layers 42, 46 can be grown, purchased, and/or the like. When the layers 42, 46 are of the same material (e.g., sapphire), the layers 42, 46 can be formed by cutting a larger layer. In any event, the sets of roughness components 44, 48 can be formed on the corresponding surfaces of the layers 42, 46, respectively. Formation of the sets of roughness components 44, 48 can include selective deposition and/or etching of nanoscale objects, such as nanodots and/or nanorods, of the material to form the large and/or small roughness components 44, 48 described herein. Such deposition and/or etching can be used to form periodic and/or non-periodic random patterns on the corresponding surfaces of the layers 42, 46. Subsequently, the filler material 52 can be deposited on the first layer 42 and/or the second layer 46 and the sets of roughness components 44, 48 can be attached with the bonding material 50, e.g., by applying the bonding material 50 to the first layer 42 and/or the second layer 46 and pressing the layers 42, 46 together. When the interface 40 corresponds to an interface between the device 10 and the surrounding environment, such as the interface 40A shown in FIG. 1, the formation also can include the removal (e.g., via etching) of material from the first layer 42 to expose/nearly expose the set of large roughness components 44.

While shown and described herein as a method of designing and/or fabricating an emitting device to improve extraction of light from the device, it is understood that aspects of the invention further provide various alternative embodiments. For example, aspects of the invention can be implemented to facilitate the transmission of light within the device, e.g., as part of optical pumping of a laser light generating structure, excitation of a carrier gas using a laser pulse, and/or the like. Similarly, an embodiment of the invention can be implemented in conjunction with a sensing device, such as a photosensor or a photodetector. In each case, a profiled surface can be included in an exterior surface of the device and/or an interface of two adjacent layers of the device in order to facilitate the transmission of light through the interface in a desired direction.

Figure 9:
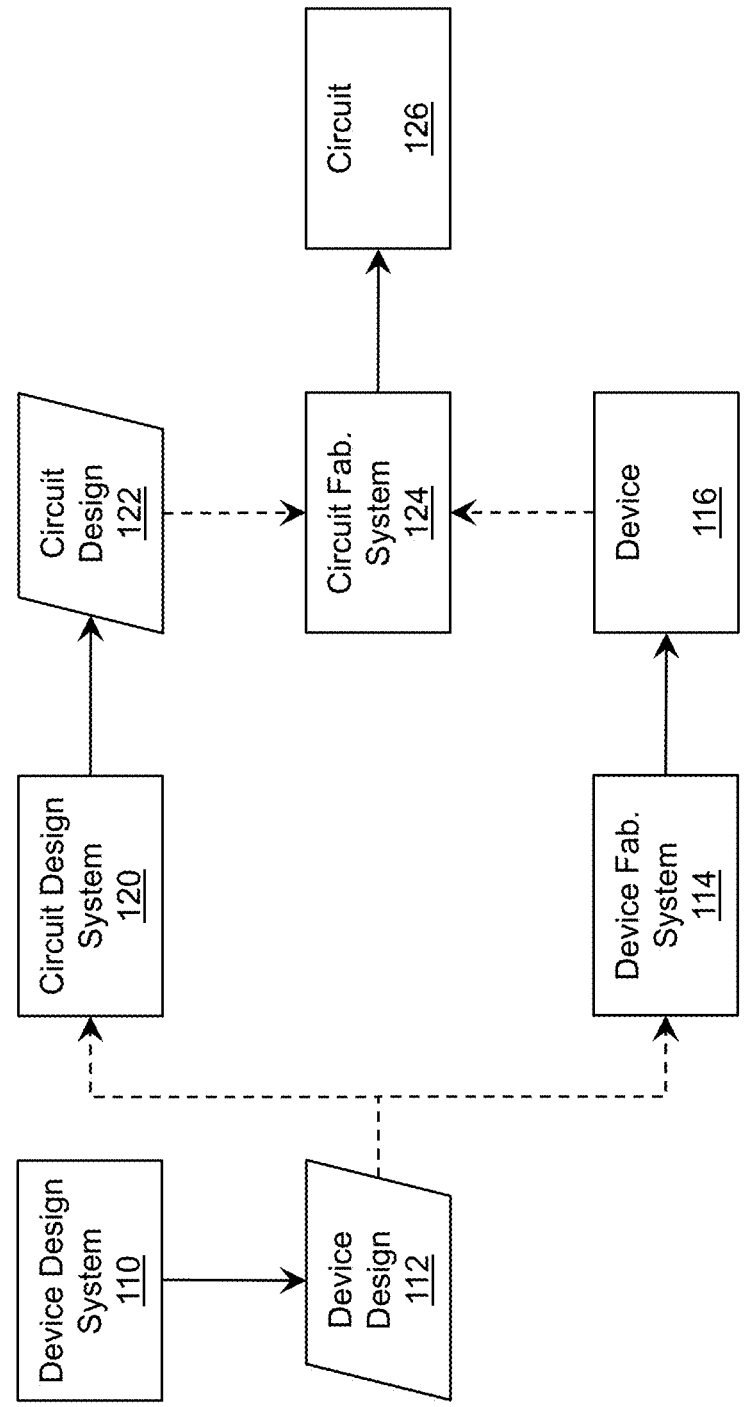
FIG. 9 shows an illustrative flow diagram for fabricating a circuit according to an embodiment.

In one embodiment, the invention provides a method of designing and/or fabricating a circuit that includes one or more of the devices designed and fabricated as described herein. To this extent, FIG. 9 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A device comprising:
   a first at least partially transparent layer having a first profiled surface, wherein the first profiled surface comprises a set of large roughness components providing a first variation of the first profiled surface having a first characteristic scale;
   a second at least partially transparent layer having a second profiled surface facing and adjacent to the first profiled surface, wherein the second profiled surface comprises a set of small roughness components providing a second variation of the second profiled surface having a second characteristic scale, and wherein the first characteristic scale is approximately an order of magnitude larger than the second characteristic scale; and
   bonding material attaching the first profiled surface and the second profiled surface, wherein the bonding material has a refractive index between or equal to one of the refractive indexes of a material of the first at least partially transparent layer and a material of the second at least partially transparent layer.

2. The device of claim 1, wherein at least one of the first variation or the second variation is a non-periodic random variation.

3. The device of claim 1, wherein the set of large roughness components comprises a series of shapes being at least one of: a truncated pyramid or a truncated cone.

4. The device of claim 3, wherein the series of shapes are inversely truncated to facilitate focusing of the radiation.

5. The device of claim 3, wherein each of the series of shapes has a cone opening angle less than normal.

6. The device of claim 3, wherein a side of each of the series of shapes forms an angle with the normal to a base of the shape less than forty-five degrees.

7. The device of claim 3, further comprising filler material located in at least some of the spaces between the set of large roughness components.

8. The device of claim 1, wherein the second profiled surface is not complementary to the first profiled surface.

9. The device of claim 1, wherein the set of small roughness components forms a photonic crystal.

10. The device of claim 1, wherein the device is configured to operate as one of: a light emitting diode, a laser diode, or a super-luminescent light emitting diode.

11. A method comprising:
    creating a device design defining a plurality of attributes of a device including an interface between a first at least partially transparent layer and a second at least partially transparent layer, wherein the interface in the device design includes:
    a first profiled surface of the first at least partially transparent layer, wherein the first profiled surface comprises a set of large roughness components providing a first variation of the first profiled surface having a first characteristic scale;
    a second profiled surface of the second at least partially transparent layer facing and adjacent to the first profiled surface, wherein the second profiled surface comprises a set of small roughness components providing a second variation of the second profiled surface having a second characteristic scale, and wherein the first characteristic scale is approximately an order of magnitude larger than the second characteristic scale; and bonding material attaching the first profiled surface and the second profiled surface, wherein the bonding material has a refractive index between or equal to one of the refractive indexes of a material of the first at least partially transparent layer and a material of the second at least partially transparent layer; and storing the device design on a non-transitory computer readable medium.

12. The method of claim 11, further comprising fabricating the device including the first at least partially transparent layer and the second at least partially transparent layer according to the device design, wherein the fabricating includes fabricating the interface.

13. The method of claim 12, wherein the fabricating the interface includes forming at least one of: the set of large roughness components or the set of small roughness components using at least one of: selective deposition or selective etching.

14. The method of claim 12, wherein the set of large roughness components comprises a series of shapes being at least one of: a truncated pyramid or a truncated cone, and wherein the set of small roughness components comprises a plurality of peaks and valleys of a material forming the second at least partially transparent layer.

15. The method of claim 12, wherein the fabricating the interface includes:

selecting a bonding material based on a refractive index of at least one of: a material of the first at least partially transparent layer or a material of the second at least partially transparent layer; and bonding the first profiled surface to the second profiled surface using the bonding material.

16. The method of claim 12, wherein the fabricating the interface includes depositing a filler material on at least a portion of at least one of: the first profiled surface or the second profiled surface, wherein the filler material at least partially fills at least some of the spaces between the set of large roughness components.

17. An emitting device comprising:

an active region configured to generate radiation;

a first at least partially transparent layer having a first profiled surface, wherein the first profiled surface comprises a set of large roughness components providing a first variation of the first profiled surface having a first characteristic scale;

a second at least partially transparent layer having a second profiled surface facing and adjacent to the first profiled surface, wherein the second profiled surface comprises a set of small roughness components providing a second variation of the second profiled surface having a second characteristic scale, wherein the first characteristic scale is approximately an order of magnitude larger than the second characteristic scale, and wherein radiation generated by the active region passes through the second at least partially transparent layer before entering the first at least partially transparent layer; and bonding material attaching the first profiled surface and the second profiled surface, wherein the bonding material has a refractive index between or equal to one of the refractive indexes of a material of the first at least partially transparent layer and a material of the second at least partially transparent layer.

18. The device of claim 17, wherein the set of large roughness components comprises a series of shapes being at least one of: a truncated pyramid or a truncated cone.

19. The device of claim 17, wherein the set of small roughness components comprises a plurality of peaks and valleys of a material forming the second at least partially transparent layer.

20. The device of claim 17, wherein the first at least partially transparent layer and the second at least partially transparent layer are sapphire.

* * * * *